US008524577B2

(12) United States Patent
Phua et al.

(10) Patent No.: US 8,524,577 B2
(45) Date of Patent: *Sep. 3, 2013

(54) SEMICONDUCTOR DEVICE AND METHOD OF FORMING RECONSTITUTED WAFER WITH LARGER CARRIER TO ACHIEVE MORE EWLB PACKAGES PER WAFER WITH ENCAPSULANT DEPOSITED UNDER TEMPERATURE AND PRESSURE

(75) Inventors: Yoke Hor Phua, Singapore (SG); Yung Kuan Hsiao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/366,008

(22) Filed: Feb. 3, 2012

(65) Prior Publication Data

US 2013/0127018 A1    May 23, 2013

Related U.S. Application Data

(63) Continuation-in-part of application No. 13/295,843, filed on Nov. 14, 2011.

(60) Provisional application No. 61/544,248, filed on Oct. 6, 2011.

(51) Int. Cl.
H01L 21/00      (2006.01)

(52) U.S. Cl.
USPC .......................................... 438/464; 438/460

(58) Field of Classification Search
USPC ................. 438/112, 124, 126, 127, 458, 460, 438/462, 463, 464; 257/788
See application file for complete search history.

(56) References Cited

U.S. PATENT DOCUMENTS

| 5,834,340 | A   | * | 11/1998 | Sawai et al. ................... 438/126 |
| 5,888,883 | A   | * | 3/1999  | Sasaki et al. .................. 438/460 |
| 6,919,232 | B2  | * | 7/2005  | Hedler et al. ................. 438/127 |
| 7,759,163 | B2  | * | 7/2010  | Kroeninger et al. .......... 438/113 |
| 2004/0110323 | A1 | * | 6/2004  | Becker et al. ................ 438/127 |
| 2007/0235897 | A1 | * | 10/2007 | Brunnbauer et al. ..... 264/272.13 |
| 2008/0241998 | A1 | * | 10/2008 | Swirbel ........................ 438/113 |
| 2008/0254575 | A1 |   | 10/2008 | Fuergut et al. |
| 2010/0078822 | A1 | * | 4/2010  | Bauer et al. ................... 257/773 |
| 2011/0049694 | A1 | * | 3/2011  | Chandrasekaran et al. .. 257/686 |

OTHER PUBLICATIONS

T. Meyer, System Integration with eWLB, Infineon Technologies AG, 93049 Regensburg.

* cited by examiner

*Primary Examiner* — N Drew Richards
*Assistant Examiner* — Jay C Chang
(74) *Attorney, Agent, or Firm* — Robert D. Atkins; Patent Law Group: Atkins & Associates, P.C.

(57) ABSTRACT

A semiconductor wafer has a plurality of semiconductor die distributed over a surface area. The semiconductor die are singulated from the semiconductor wafer. The semiconductor die are mounted to a carrier to form a reconstituted semiconductor wafer. The carrier has a surface area 10-50% larger than the surface area of the semiconductor wafer. The number of semiconductor die mounted to the carrier is greater than a number of semiconductor die singulated from the semiconductor wafer. The reconstituted wafer is mounted within a chase mold. The chase mold is closed with the semiconductor die disposed within a cavity of the chase mold. An encapsulant is dispersed around the semiconductor die within the cavity under temperature and pressure. The encapsulant can be injected into the cavity of the chase mold. The reconstituted wafer is removed from the chase mold. An interconnect structure is formed over the reconstituted wafer.

22 Claims, 11 Drawing Sheets

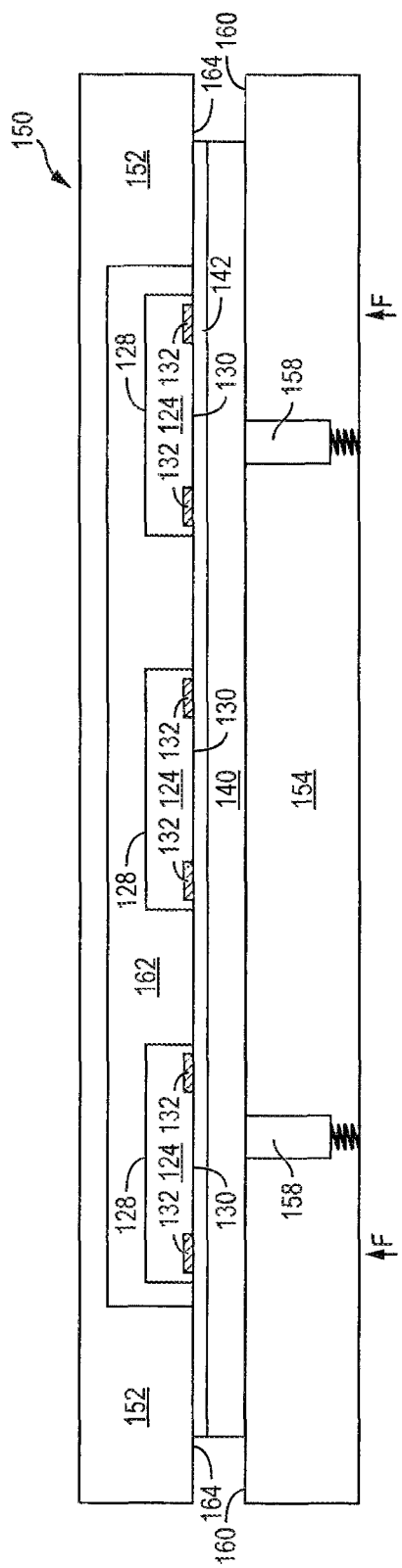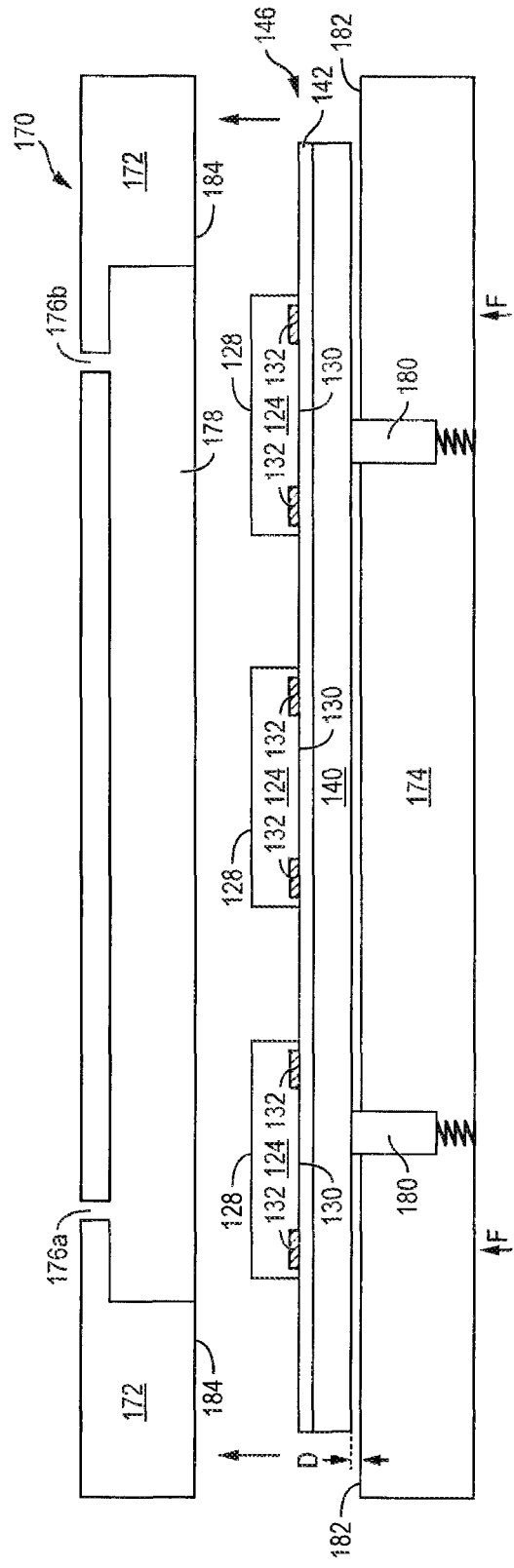
FIG. 4g
FIG. 4h

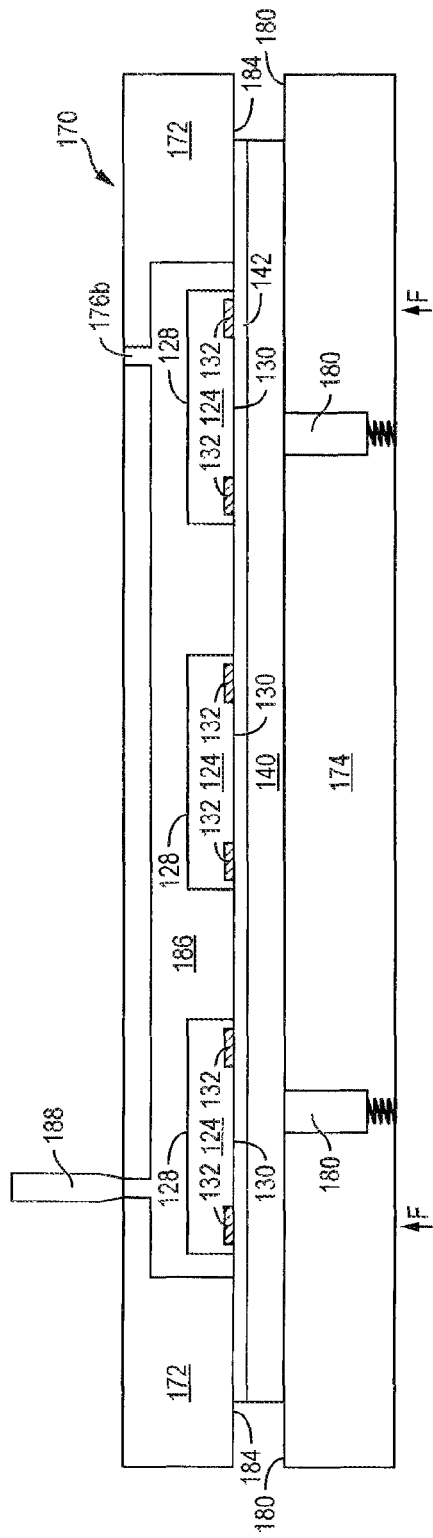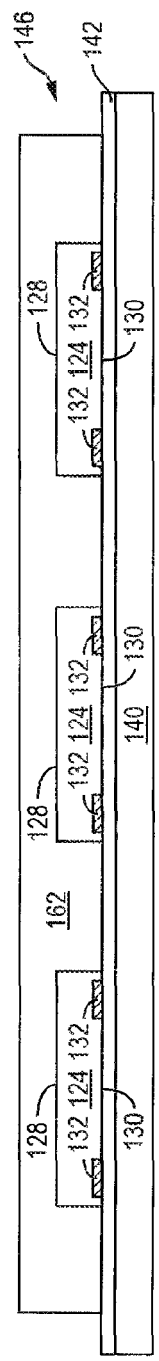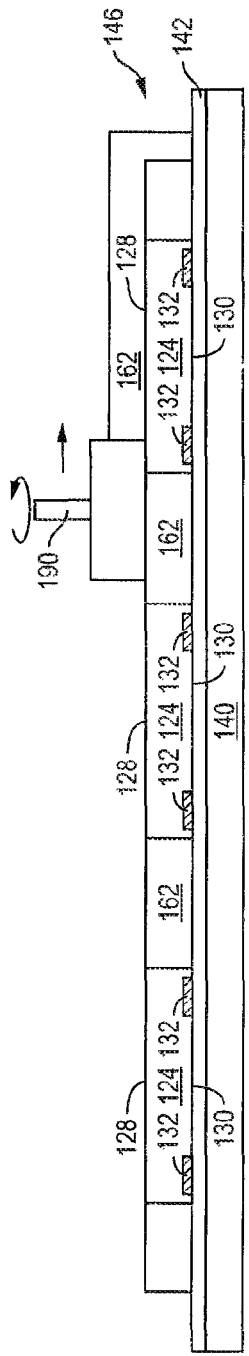
FIG. 4i
FIG. 4j
FIG. 4k

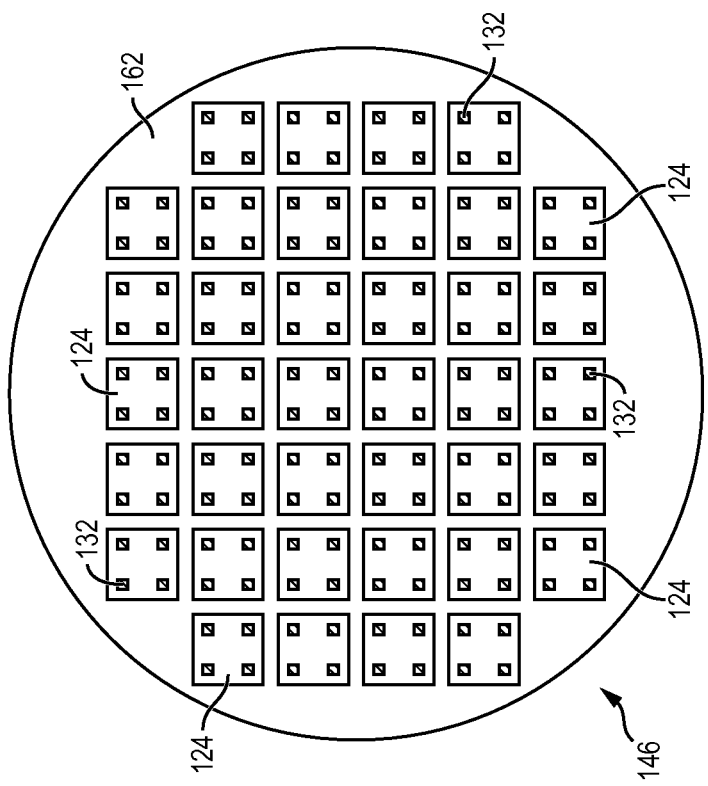
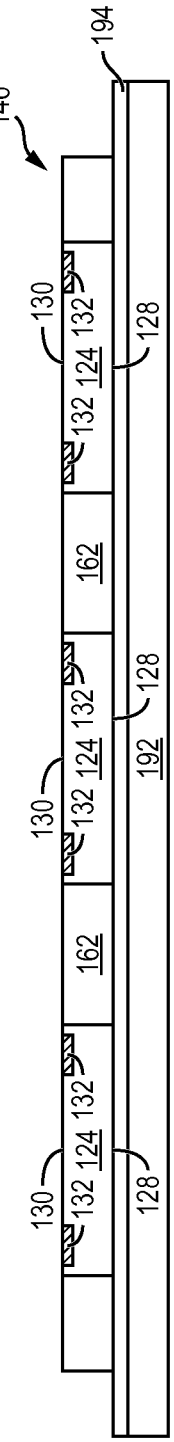
FIG. 4l
FIG. 4m

US 8,524,577 B2

SEMICONDUCTOR DEVICE AND METHOD OF FORMING RECONSTITUTED WAFER WITH LARGER CARRIER TO ACHIEVE MORE EWLB PACKAGES PER WAFER WITH ENCAPSULANT DEPOSITED UNDER TEMPERATURE AND PRESSURE

CLAIM TO DOMESTIC PRIORITY

The present application is a continuation-in-part of U.S. application Ser. No. 13/295,843, filed Nov. 14, 2011, which claims the benefit of Provisional Application No. 61/544,248, filed Oct. 6, 2011.

FIELD OF THE INVENTION

The present invention relates in general to semiconductor devices and, more particularly, to a semiconductor device and method of forming a reconstituted semiconductor wafer with a larger carrier to achieve more eWLB packages per wafer with an encapsulant deposited under temperature and pressure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer typically contains a plurality of semiconductor die separated by a saw street. Active and passive circuits are formed in a surface of each semiconductor die. An interconnect structure can be formed over the surface of the semiconductor die. The semiconductor wafer is singulated into individual semiconductor die for use in a variety of electronic products. An important aspect of semiconductor manufacturing is high yield and corresponding low cost.

SUMMARY OF THE INVENTION

A need exists to efficiently manufacture semiconductor die with an emphasis on high yield and low cost. Accordingly, in one embodiment, the present invention is a method of making a semiconductor device comprising the steps of providing a semiconductor wafer including a plurality of semiconductor die formed within a surface area of the semiconductor wafer, singulating the semiconductor die from the semiconductor wafer, providing a carrier having a surface area larger than the surface area of the semiconductor wafer, and mounting the semiconductor die to the carrier to form a reconstituted wafer. A number of semiconductor die mounted to the carrier is greater than a number of semiconductor die singulated from the semiconductor wafer. The method further includes the steps of providing a chase mold, disposing the reconstituted wafer within the chase mold, closing the chase mold with the semiconductor die disposed within a cavity of the chase mold, dispersing an encapsulant around the semiconductor die within the cavity under temperature and pressure, removing the reconstituted wafer from the chase mold, and forming an interconnect structure over the reconstituted wafer.

In another embodiment, the present invention is a method of making a semiconductor device comprising the steps of providing a plurality of semiconductor die, providing a carrier, mounting the semiconductor die to the carrier to form a reconstituted wafer, providing a chase mold, disposing the reconstituted wafer within the chase mold, closing the chase mold with the semiconductor die and encapsulant disposed within a cavity of the chase mold, dispersing an encapsulant around the semiconductor die within the cavity under temperature and pressure, removing the reconstituted wafer from the chase mold, and forming an interconnect structure over the reconstituted wafer.

In another embodiment, the present invention is a method of making a semiconductor device comprising the steps of providing a semiconductor wafer including a plurality of semiconductor die formed within a surface area of the semiconductor wafer, singulating the semiconductor die from the semiconductor wafer, providing a carrier having a surface area larger than the surface area of the semiconductor wafer, and mounting the semiconductor die to the carrier to form a reconstituted wafer. A number of semiconductor die mounted to the carrier is greater than a number of semiconductor die singulated from the semiconductor wafer.

In another embodiment, the present invention is a semiconductor device made by a process comprising the steps of providing a semiconductor wafer including a plurality of semiconductor die formed within a surface area of the semiconductor wafer, singulating the semiconductor die from the semiconductor wafer, providing a carrier having a surface area larger than the surface area of the semiconductor wafer, and mounting the semiconductor die to the carrier to form a reconstituted wafer. A number of semiconductor die mounted to the carrier is greater than a number of semiconductor die singulated from the semiconductor wafer.

In another embodiment, the present invention is a method of making a semiconductor device comprising the steps of providing a semiconductor wafer including a plurality of semiconductor die formed within a surface area of the semiconductor wafer, singulating the semiconductor die from the semiconductor wafer, providing a first carrier having a surface area larger than a surface area of a second carrier, and mounting the semiconductor die to the first carrier using a set of manufacturing tools to form a reconstituted wafer. A first number of the semiconductor die mounted to the first carrier is greater than a second number of the semiconductor die that can be mounted to the second carrier smaller than the first carrier using the set of manufacturing tools.

DETAILED DESCRIPTION OF THE DRAWINGS

Figure 1:
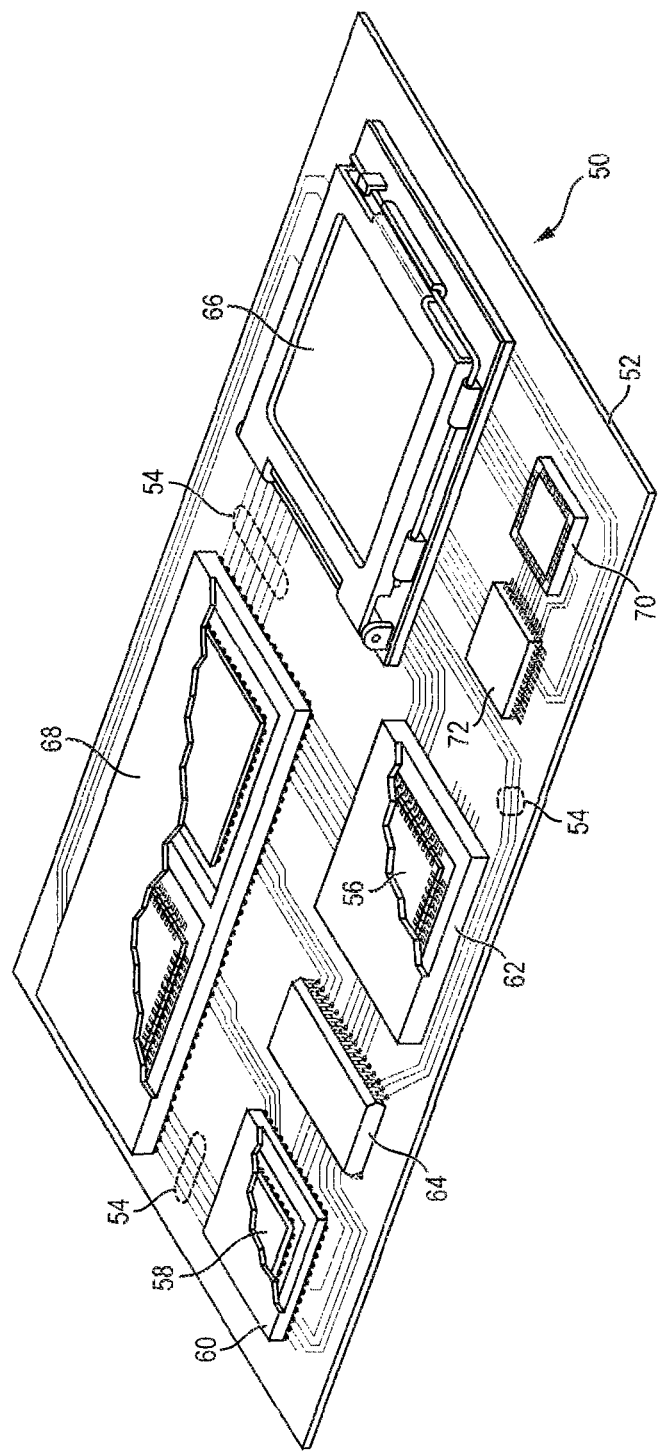
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purpose of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
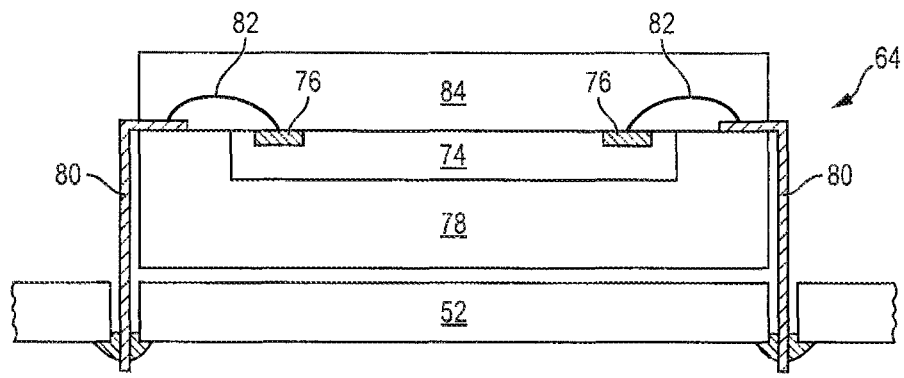
FIGS. 2a-2c illustrate further detail of the representative semiconductor packages mounted to the PCB.
Figure 2B:
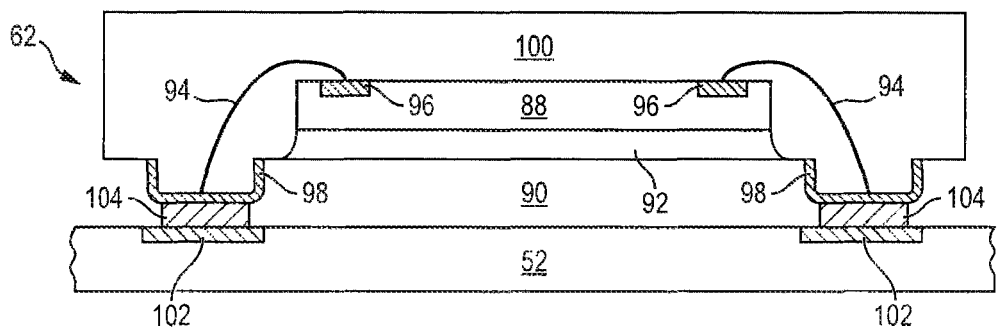
Figure 2C:
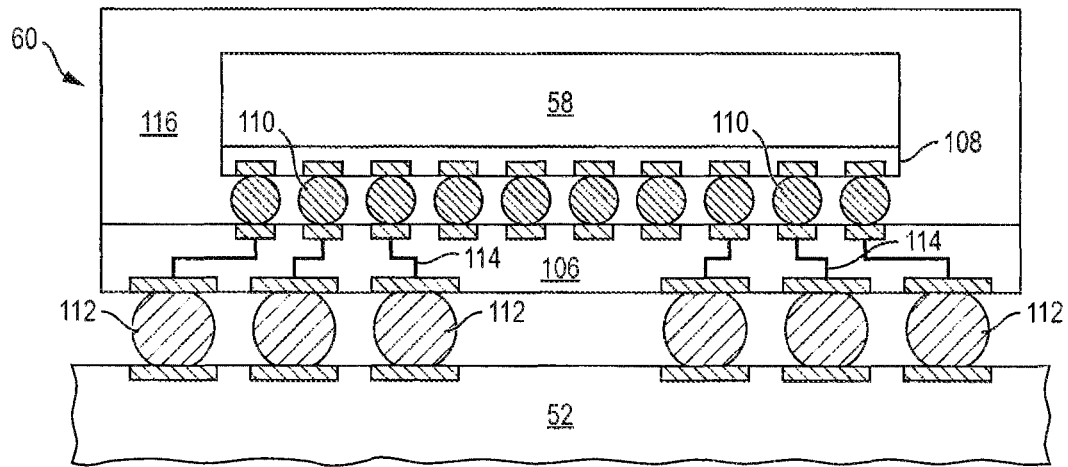

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted to carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
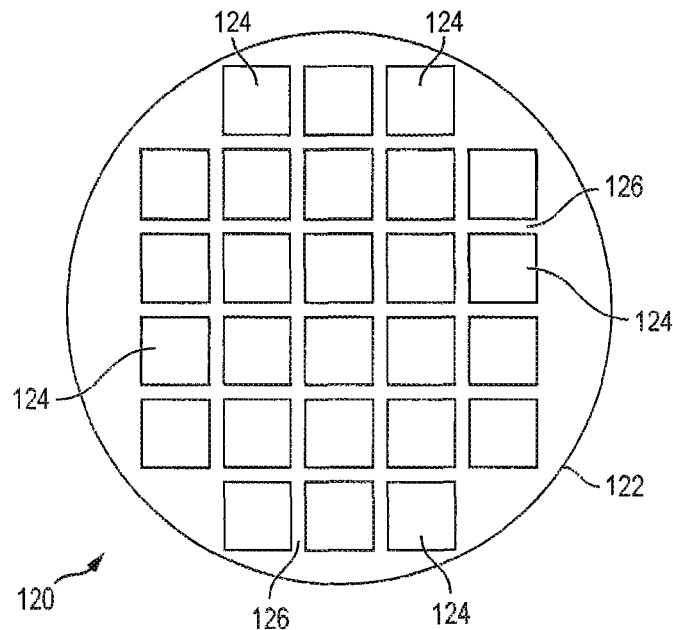
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
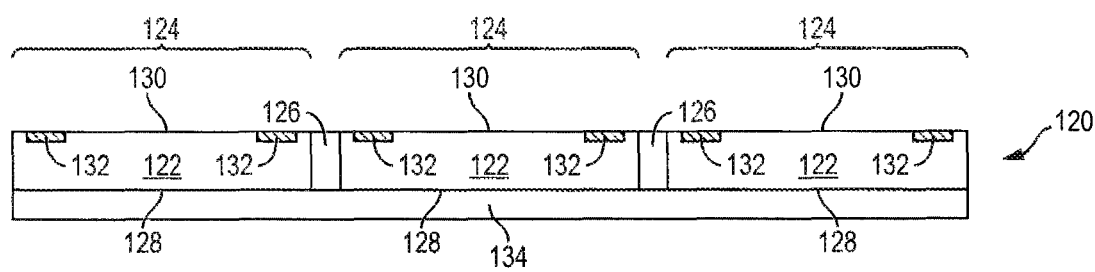

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flip chip type device.

A support carrier or laminated dicing tape 134 is applied to back surface 128 of semiconductor wafer 120. Laminated dicing tape 134 provides support for semiconductor wafer 120 during subsequent manufacturing steps and singulation into individual semiconductor die 124.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
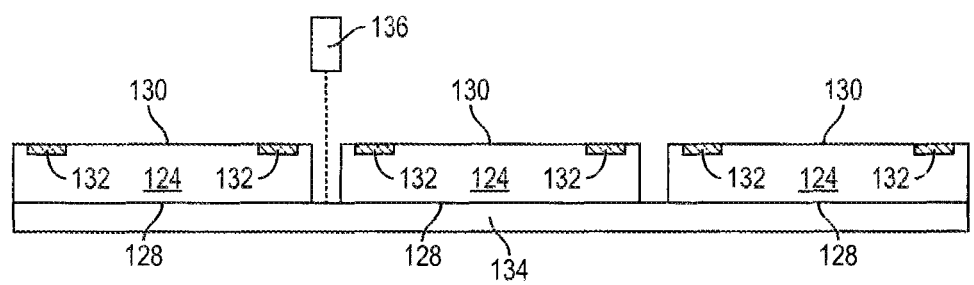

In FIG. 3c, semiconductor wafer 120 is singulated through saw street 126 using a saw blade or laser cutting tool 136 into individual semiconductor die 124. Lamination dicing tape 134 is removed.

Figure 4A:
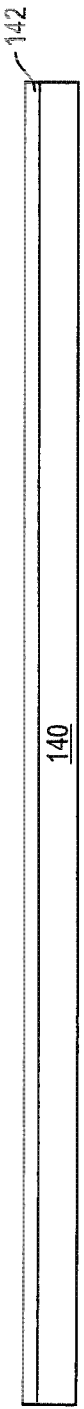
FIGS. 4a-4o illustrate a process of forming a reconstituted semiconductor wafer with a larger carrier to achieve more eWLB packages per wafer.
Figure 4B:
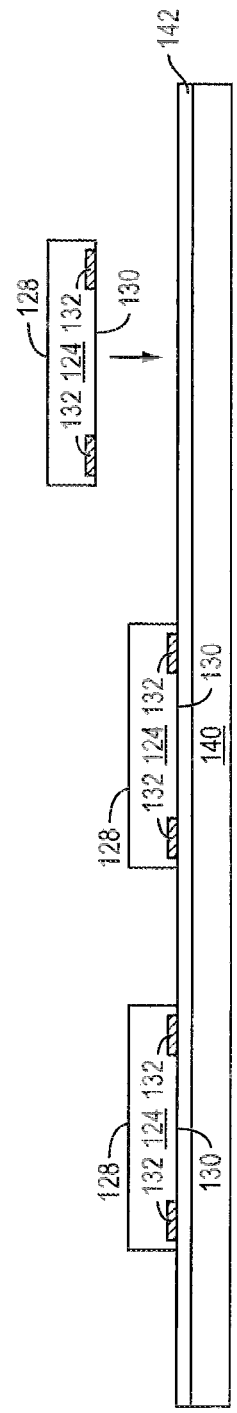
Figure 4C:
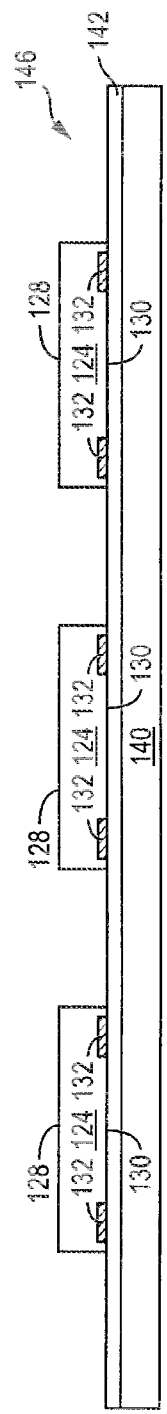
Figure 4D:
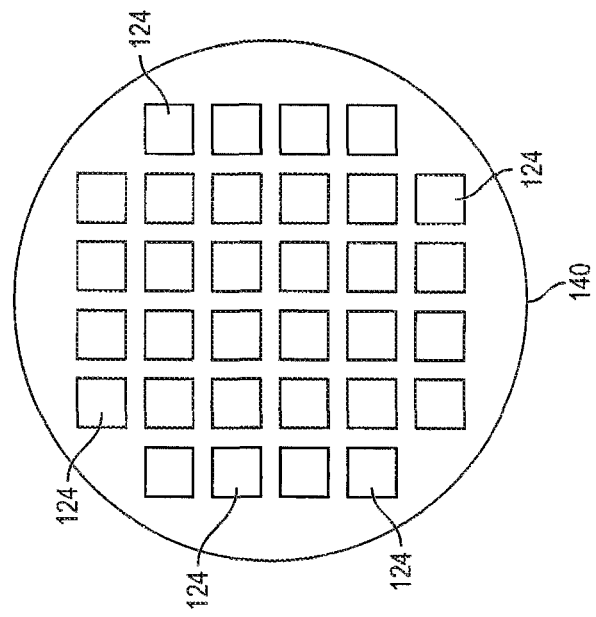
Figure 4D:
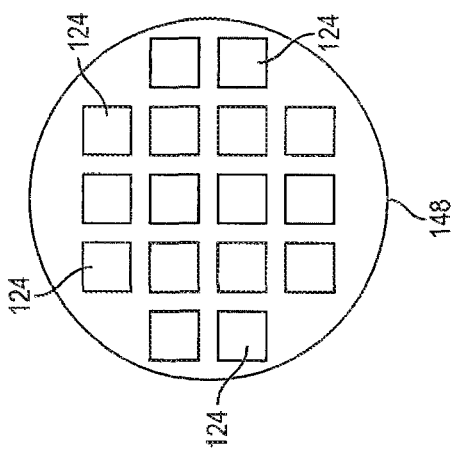
Figure 4E:
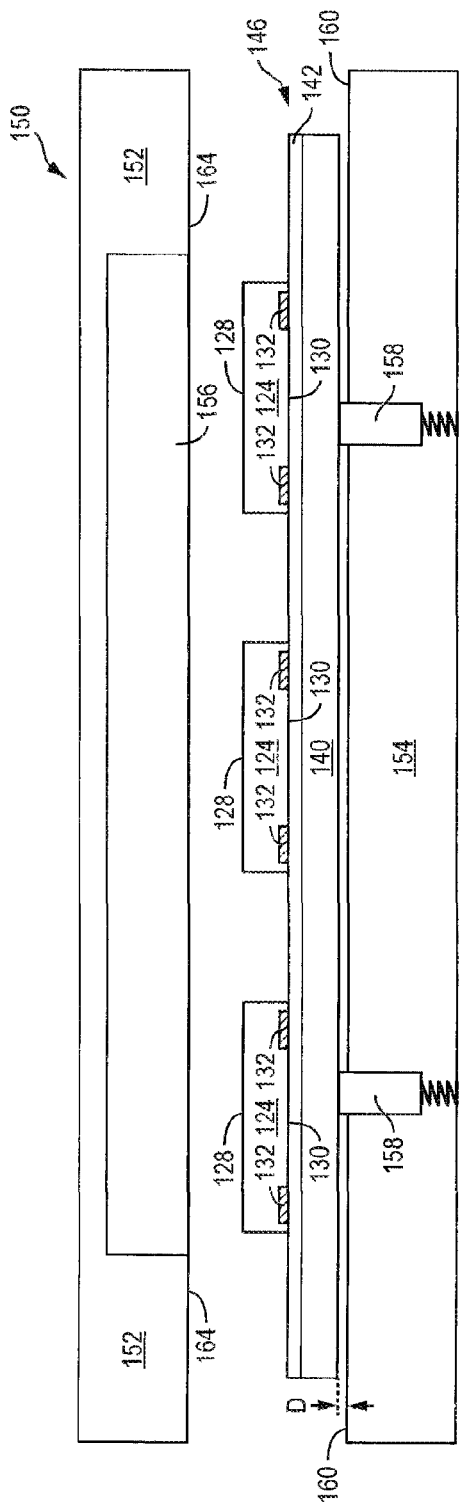
Figure 4F:
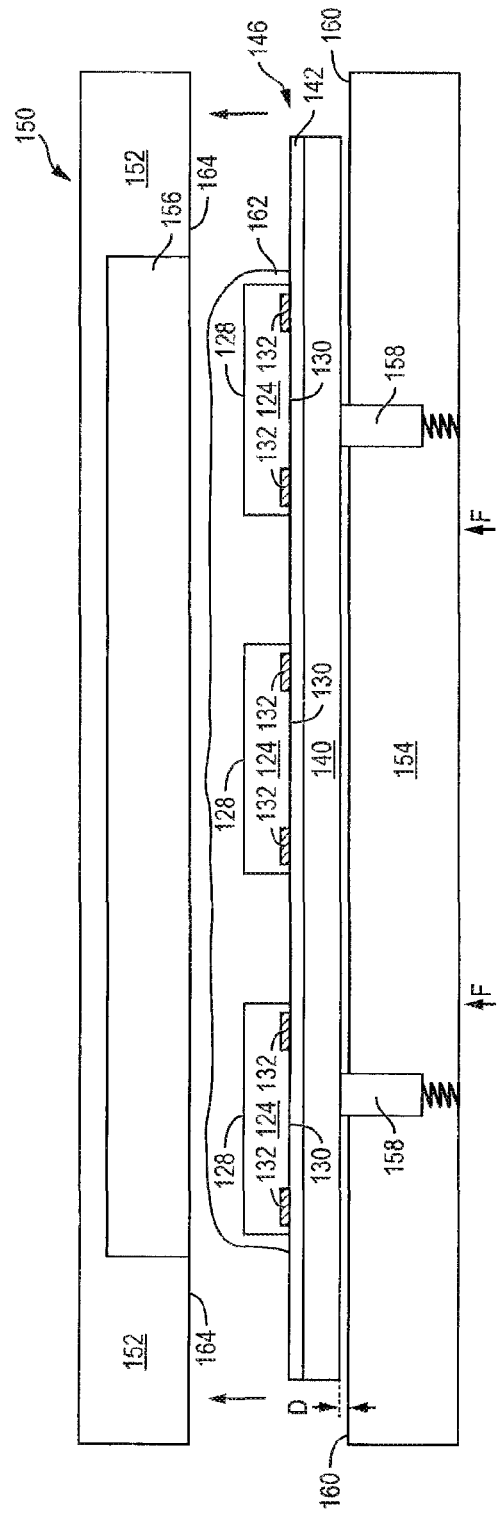
Figure 4N:
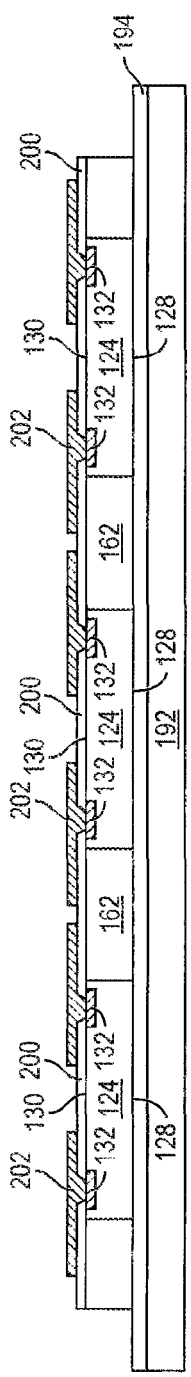
Figure 4O:
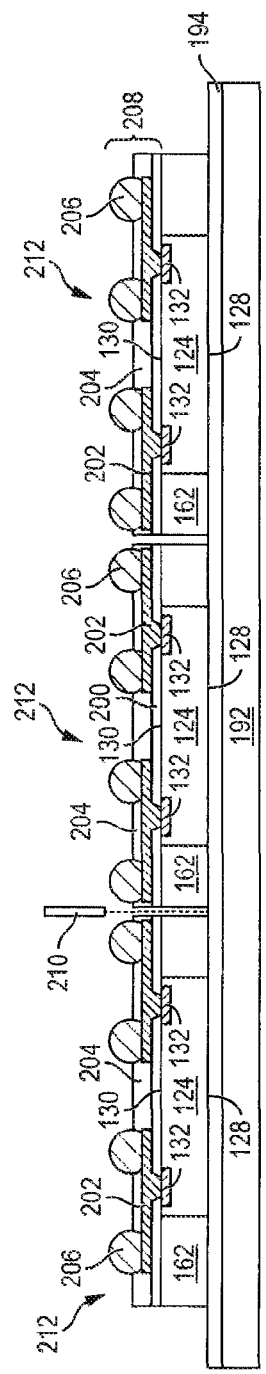

FIGS. 4a-4o illustrate, in relation to FIGS. 1 and 2a-2c, a process of forming a reconstituted semiconductor wafer with a larger carrier to achieve more eWLB packages per wafer with an encapsulant deposited under temperature and pressure. FIG. 4a shows a temporary substrate or carrier 140 containing sacrificial base material such as silicon, polymer, beryllium oxide, glass, or other suitable low-cost, rigid material for structural support. Alternatively, carrier 140 can be metal, such as nickel, platinum, copper, copper alloys (including one or more elements of nickel, iron, zinc, tin, chromium, silver, and phosphorous), or other suitable rigid material for structural support. Carrier 140 can be circular, rectangular, or other shape or form factor with diameters or widths in the range of 100-550 millimeters (mm). In one embodiment, carrier 140 is circular with a diameter of 550 mm. An interface layer or double-sided tape 142 is formed over carrier 140 as a temporary adhesive bonding film, etch-stop layer, or release layer.

Carrier 140 has a larger diameter and surface area as compared to the diameter and surface area of semiconductor wafer 120. In one embodiment, carrier 140 has a surface area that is 10-50% greater than the surface area of semiconductor wafer 120. If semiconductor wafer 120 has a diameter of 300 mm, then carrier 140 is made with a diameter of 310-350 mm. In other cases, if semiconductor wafer 120 has a diameter of 150 mm, then carrier 140 is made with a diameter of 180 mm, giving a 44% increase in surface area. If semiconductor wafer 120 has a diameter of 200 mm, then carrier 140 is made with a diameter of 240 mm, giving a 44% increase in surface area. If semiconductor wafer 120 has a diameter of 450 mm, then carrier 140 is made with a diameter of 550 mm, giving a 49% increase in surface area.

In FIG. 4b, semiconductor die 124 from FIGS. 3a-3c is positioned over and mounted to carrier 140 using a pick and place operation with active surface 130 oriented toward the carrier. FIG. 4c shows semiconductor die 124 mounted to carrier 140 as reconstituted semiconductor wafer 146.

Semiconductor die 124 can be a known good semiconductor die (KGD), i.e. semiconductor die that have been functionally and reliability tested, inspected, passed, and known to be capable of all designed attributes and operational states once a power supply potential is applied. The KGD testing includes confirmation of functional operation, AC and DC parameters, temperature cycling, burn-in qualifications, reliability testing, environmental testing, visual and automated inspection, mechanical testing, interconnect specifications, and other levels of quality assurance to comply with design specifications. The KGD testing identifies defective semiconductor die for removal from the manufacturing process prior to higher level assembly, e.g., semiconductor packages and PCBs. The KGD increase manufacturing yield and reduce costs.

The reconstituted semiconductor wafer 146 has a diameter and surface area larger than the diameter and surface area of semiconductor wafer 120. In one embodiment, reconstituted semiconductor wafer 146 has a surface area that is 10-50% greater than the surface area of semiconductor wafer 120. The larger surface area of carrier 140 and reconstituted semiconductor wafer 146 accommodates more semiconductor die 124 and lowers manufacturing cost as more semiconductor die 124 are processed per reconstituted semiconductor wafer. The number of semiconductor die 124 mounted to carrier 140 is greater than the number of semiconductor die 124 singulated from semiconductor wafer 120. In one embodiment, the number of semiconductor die 124 mounted to carrier 140 is 10-50% more than the number of semiconductor die 124 singulated from semiconductor wafer 120. For example, the number of semiconductor die 124 mounted to carrier 140 is 10-50% more than the number of semiconductor die 124 singulated from semiconductor wafer 120.

Alternatively, the number of semiconductor die 124 mounted to carrier 140 is 10-50% more than the number of semiconductor die 124 that could be mounted to a smaller carrier 148, as shown in FIG. 4d. If carrier 148 has a diameter of 300 mm, then carrier 140 is made with a diameter of 310-350 mm. In other cases, if carrier 148 has a diameter of 150 mm, then carrier 140 is made with a diameter of 180 mm, giving a 44% increase in surface area. If carrier 148 has a diameter of 200 mm, then carrier 140 is made with a diameter of 240 mm, giving a 44% increase in surface area. If carrier 148 has a diameter of 450 mm, then carrier 140 is made with a diameter of 550 mm, giving a 49% increase in surface area. In other cases, the number of semiconductor die 124 mounted to carrier 140 is 100% or greater more than the number of semiconductor die 124 that could be mounted to a smaller carrier. The larger number of semiconductor die 124 are mounted to larger carrier 140 with the same set of manufacturing and processing tools as used for a smaller carrier 148. The larger carrier 140 increases manufacturing throughput and achieves a lower cost per unit without retooling or other process variation.

FIG. 4e shows a chase mold 150 having an upper mold support 152 and lower mold support 154. Upper mold support 152 has a cavity 156 for containing semiconductor die 124 and encapsulant or molding compound. Lower mold support 152 includes a plurality of spring-loaded lifter pins 158. The reconstituted semiconductor wafer 146 is placed over lower mold support 154 with the surface of carrier 140, opposite semiconductor die 124, contacting spring-loaded lifter pins 158. The spring-loaded lifter pins 158 in a relaxed or non-compressed state maintain a separation by distance D between carrier 140 and surface 160 of lower mold support 154. In one embodiment, the separation distance D is 0.5 mm to avoid initial heat transfer to reconstituted semiconductor wafer 146.

In FIG. 4f, a volume of encapsulant or molding compound 162 is deposited over semiconductor die 124 and interface layer 142 of carrier 140. Encapsulant 162 can be a polymer composite material, such as epoxy resin with filler, epoxy acrylate with filler, or polymer with proper filler. The volume of encapsulant 162 is measured according to the space requirements of cavity 156 less the area occupied by semiconductor die 124. In one embodiment, the volume of encapsulant 162 ranges between 20-250 grams for a carrier diameter of 300 mm.

The upper mold support 152 and lower mold support 154 are brought together under pressure with force F to close chase mold 150 with semiconductor die 124 and encapsulant 162 disposed within cavity 156, as shown in FIG. 4g. As interface layer 142 contacts surface 164 of upper mold support 152, spring-loaded lifter pins 158 begin to compress. The movement of lower mold support 154 towards upper mold support 152 continues until opposing surfaces of interface layer 142 and carrier 140 contact surface 160 of lower mold support 154 and surface 164 of upper mold support 152. Spring-loaded lifter pins 158 are fully compressed under a clamping force F of 50-500 kilo-Newtons (kN) between upper mold support 152 and lower mold support 154.

Heat is transferred through upper mold support 152 and lower mold support 154 to bring encapsulant 162 to a viscous state. Encapsulant 162 is evenly dispersed and uniformly distributed under an elevated temperature within cavity 156 around semiconductor die 124. In one embodiment, the molding temperature ranges from 80-150° C. with a molding time of 250-1000 seconds. The molding cure temperature ranges from 100-180° C. with a molding cure time of 20-120 minutes. The temperature and pressure within chase mold 150 provides a planar encapsulant coverage with less warpage. The thickness of encapsulant 162 remains uniform, e.g. less than 5% deviation, across reconstituted semiconductor wafer 146.

In another embodiment, continuing from FIG. 4d, chase mold 170 has an upper mold support 172 and lower mold support 174, as shown in FIG. 4h. Upper mold support 172 has a plurality of inlets 176 into cavity 178 for containing semiconductor die 124 and encapsulant or molding compound. Lower mold support 174 includes a plurality of spring-loaded lifter pins 180. The reconstituted semiconductor wafer 146 is placed over lower mold support 174 with the lower surface of carrier 140 contacting spring-loaded lifter pins 180. The spring-loaded lifter pins 180 in a relaxed or non-compressed state maintain a separation by distance D between carrier 140 and surface 182 of lower mold support 174. In one embodiment, the separation distance D is 0.5 mm to avoid initial heat transfer to reconstituted semiconductor wafer 146.

The upper mold support 172 and lower mold support 174 are brought together under pressure with force F, as shown in FIG. 4i, to close chase mold 170 with semiconductor die 124 disposed within cavity 178. As interface layer 142 contacts surface 184 of upper mold support 172, spring-loaded lifter pins 180 begin to compress. The movement of lower mold support 174 towards upper mold support 172 continues until opposing surfaces of interface layer 142 and carrier 140 contact surface 182 of lower mold support 174 and surface 184 of upper mold support 172. Spring-loaded lifter pins 180 are fully compressed under a clamping force F of 50-500 kN between upper mold support 172 and lower mold support 174.

A volume of encapsulant or molding compound 186 is injected from dispenser 188 under an elevated temperature and pressure through inlet 176a into cavity 178 and over semiconductor die 124 and interface layer 142 of carrier 140. Inlet 176b can be exhaust port for excess encapsulant 186. Encapsulant 186 can be a polymer composite material, such as epoxy resin with filler, epoxy acrylate with filler, or polymer with proper filler. The volume of encapsulant 186 is measured according to the space requirements of cavity 178 less the area occupied by semiconductor die 124. In one embodiment, the volume of encapsulant 186 ranges between 20-250 grams for a carrier diameter of 300 mm. Encapsulant 186 is evenly dispersed and uniformly distributed under an elevated temperature within cavity 178 around semiconductor die 124. In one embodiment, the molding temperature ranges from 80-150° C. with a molding time of 250-1000 seconds. The molding cure temperature ranges from 100-180° C. with a molding cure time of 20-120 minutes. The thickness of encapsulant 186 remains uniform, e.g. less than 5% deviation, across reconstituted semiconductor wafer 146.

FIG. 4j shows reconstituted semiconductor wafer 146 removed from the chase mold. In FIG. 4k, a portion of encapsulant 162 is optionally removed by grinder 190 to planarize the encapsulant with back surface 128 of semiconductor die 124. Encapsulant 162 can also be planarized by an etching process or CMP.

Carrier 140 and interface layer 142 are removed by chemical etching, mechanical peeling, CMP, mechanical grinding, thermal bake, UV light, laser scanning, or wet stripping to expose conductive layer 132 and active surface 130 of semiconductor die 124 and encapsulant 162. FIG. 4l shows a plan view of reconstituted semiconductor wafer 146 with semiconductor die 124 embedded within encapsulant 162.

FIG. 4m shows a temporary substrate or carrier 192 containing sacrificial base material such as silicon, polymer, beryllium oxide, or other suitable low-cost, rigid material for structural support. An interface layer or double-sided tape 194 is formed over carrier 192 as a temporary adhesive bonding film or etch-stop layer. The reconstituted semiconductor wafer 146 with encapsulant 162 is mounted to interface layer 194 over carrier 192 with active surface 130 oriented away from the carrier.

In FIG. 4n, an insulating or passivation layer 200 is formed over encapsulant 162, active surface 130, and conductive layer 132 using PVD, CVD, printing, spin coating, spray coating, lamination, sintering or thermal oxidation. The insulating layer 200 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 200 is removed by an etching process through a patterned photoresist layer to expose conductive layer 132.

An electrically conductive layer 202 is formed insulating layer 200 and conductive layer 132 using a patterning and metal deposition process such as printing, PVD, CVD, sputtering, electrolytic plating, and electroless plating. Conductive layer 202 can be one or more layers of Al, Cu, Sn, Ti, Ni, Au, Ag, or other suitable electrically conductive material. A portion of conductive layer 202 extends horizontally along insulating layer 200 and parallel to active surface 130 of semiconductor die 124 to laterally redistribute the electrical interconnect to conductive layer 132. Conductive layer 202 operates as a fan-out redistribution layer (RDL) for the electrical signals of semiconductor die 124. A portion of conductive layer 202 is electrically connected to conductive layer 132. Other portions of conductive layer 202 are electrically common or electrically isolated depending on the connectivity of semiconductor die 124.

In FIG. 4o, an insulating or passivation layer 204 is formed over insulating layer 200 and conductive layer 202 using PVD, CVD, printing, spin coating, spray coating, screen printing or lamination. The insulating layer 204 can be one or more layers of SiO2, Si3N4, SiON, Ta2O5, Al2O3, or other material having similar insulating and structural properties. A portion of insulating layer 204 is removed by an etching process with a patterned photoresist layer to expose conductive layer 202.

An electrically conductive bump material is deposited over the exposed conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 202 using a suitable attachment or bonding process. In one embodiment, the bump material is reflowed by heating the material above its melting point to form balls or bumps 206. In some applications, bumps 206 are reflowed a second time to improve electrical contact to conductive layer 202. Bumps 206 can also be compression bonded to conductive layer 202. Bumps 206 represent one type of interconnect structure that can be formed over conductive layer 202. The interconnect structure can also use stud bump, micro bump, or other electrical interconnect.

The combination of insulating layers 200 and 204, conductive layers 202, and bumps 206 constitute a build-up interconnect structure 208 formed over semiconductor die 124 and encapsulant 162. Additional insulating layers and RDLs can be formed in build-up interconnect structure 208 for interconnection to semiconductor die 124.

The reconstituted semiconductor wafer 146 is singulated through encapsulant 162 and build-up interconnect structure 208 with saw blade or laser cutting tool 210 into individual fan-out embedded wafer level ball grid array (eWLB) package 212. Carrier 192 and interface layer 194 are removed by chemical etching, mechanical peeling, CMP, mechanical grinding, thermal bake, UV light, laser scanning, or wet stripping.

Figure 5:
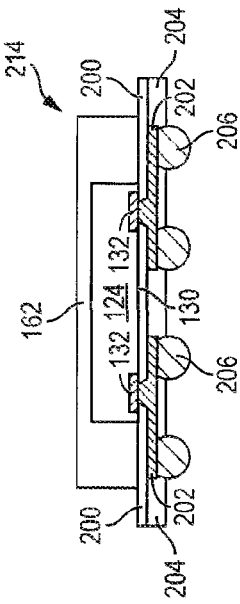
FIG. 5 illustrates the eWLB package with an encapsulant deposited under temperature and pressure.

FIG. 5 shows the fan-out eWLB 212 after singulation and removal of carrier 192 and interface layer 194. Conductive layer 132 of semiconductor die 124 is electrically connected to conductive layer 202 and bumps 206. The fan-out eWLB 212 is formed from a reconstituted semiconductor wafer 146 having a diameter and surface area larger than the diameter and surface area of semiconductor wafer 120. In one embodiment, reconstituted semiconductor wafer 146 has a surface area that is 10-50% greater than the surface area of semiconductor wafer 120. The larger surface area of carrier 140 and reconstituted semiconductor wafer 146 accommodates more semiconductor die 124 and lowers manufacturing cost as more semiconductor die 124 are processed per reconstituted semiconductor wafer. Encapsulant 162 is formed under temperature and pressure within chase mold 150 for a planar encapsulant coverage with less warpage. The thickness of encapsulant 162 remains uniform, e.g. less than 5% deviation, across reconstituted semiconductor wafer 146.

Figure 6:
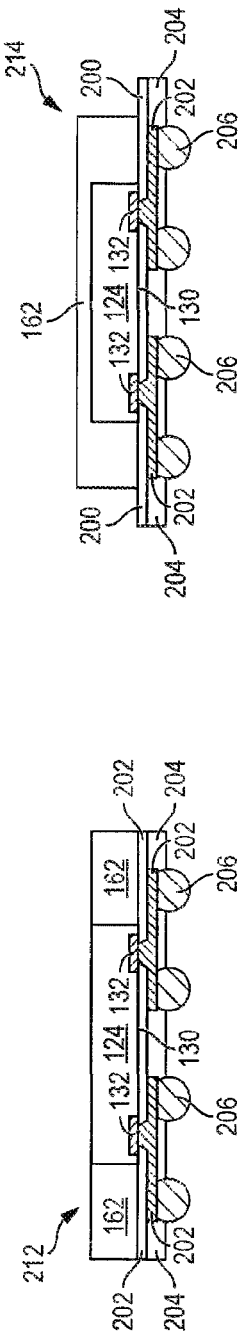
FIG. 6 illustrates the eWLB package with an encapsulant disposed over a back surface of the semiconductor die.

FIG. 6 shows an embodiment of fan-out eWLB 214 with encapsulant 162 disposed over back surface 128 of semiconductor die 124, i.e. without the optional planarization of the encapsulant shown in FIG. 4k. Conductive layer 132 of semiconductor die 124 is electrically connected to conductive layer 202 and bumps 206. The fan-out eWLB 214 is formed from a reconstituted semiconductor wafer 146 having a diameter and surface area larger than the diameter and surface area of semiconductor wafer 120. In one embodiment, reconstituted semiconductor wafer 146 has a surface area that is 10-50% greater than the surface area of semiconductor wafer 120. The larger surface area of carrier 140 and reconstituted semiconductor wafer 146 accommodates more semiconductor die 124 and lowers manufacturing cost as more semiconductor die 124 are processed per reconstituted semiconductor wafer. Encapsulant 162 is formed under temperature and pressure within chase mold 150 for a planar encapsulant coverage with less warpage. The thickness of encapsulant 162 remains uniform, e.g. less than 5% deviation, across reconstituted semiconductor wafer 146.

Figure 7:
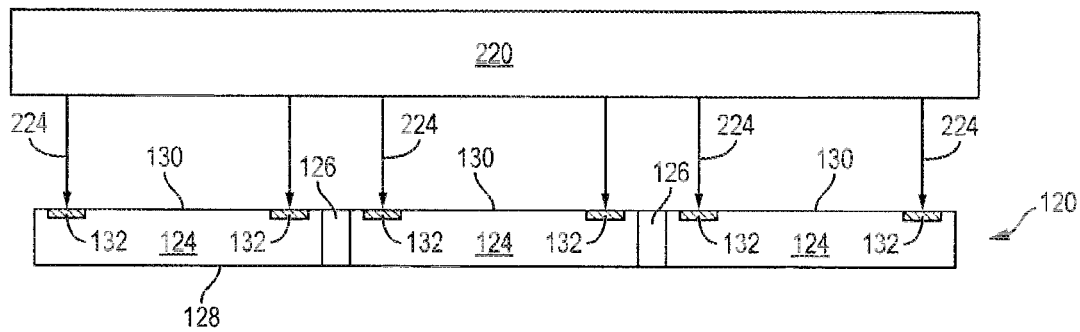
FIG. 7 illustrates electrical and mechanical testing of the semiconductor wafer to establish KGD status.
Figure 8:
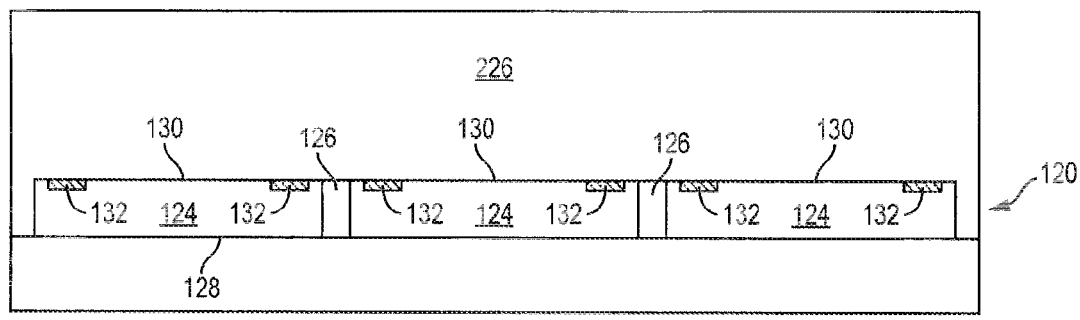
FIG. 8 illustrates reliability testing of the semiconductor wafer to establish KGD status.

FIGS. 7 and 8 illustrate the testing process to establish KGD status of semiconductor die 124 prior to mounting to carrier 140, i.e. at the wafer level. FIG. 7 shows testing station 220 with wafer test probes 224 electrically connected to conductive layer 132 on each semiconductor die 124 contained in semiconductor wafer 120. Testing station 220 performs full electrical and mechanical testing of each semiconductor 124 while in wafer form. FIG. 8 shows testing station 226 for temperature cycling, burn-in qualifications, reliability testing, and environmental testing of semiconductor die 124 contained in semiconductor wafer 120. Once the KGD status of semiconductor die 124 is established, the semiconductor die are mounted to carrier 140, as described in FIGS. 4b-4d.

In summary, semiconductor wafer 120 includes a plurality of semiconductor die 124 formed within a surface area of the semiconductor wafer. Semiconductor die 124 are singulated from semiconductor wafer 120. A carrier 140 has a surface area larger than the surface area of semiconductor wafer 120. The surface area of carrier 140 is 10-50% greater than the surface area of semiconductor wafer 120. Semiconductor die 124 are mounted to carrier 140 to form reconstituted semiconductor wafer 146. Semiconductor die 124 can be KGD. The number of semiconductor die 124 mounted to carrier 140 is greater than the number of semiconductor die 124 singulated from semiconductor wafer 120. Alternatively, the number of the semiconductor die mounted to carrier 140 is greater than the number of the semiconductor die that can be mounted to carrier 148, which is smaller than carrier 140, using the same set of manufacturing tools.

The reconstituted semiconductor wafer 146 is disposed within chase mold 150. Chase mold 150 is closed with semiconductor die 124 disposed within cavity 156 of the chase mold. In one embodiment, upper mold support 152 includes cavity 156. A lower mold support 154 has spring-loaded lifter pins 158. The reconstituted semiconductor wafer 146 is disposed over spring-loaded lifter pins 158. Encapsulant 162 is deposited over reconstituted semiconductor wafer 146. Chase mold 150 is closed so that lower mold support 154 and upper mold support 152 contact carrier 140 under pressure to enclose semiconductor die 124 and encapsulant 162 within cavity 156 of the upper mold support and compress spring-loaded lifter pins 158. Encapsulant 162 is dispersed around semiconductor die 124 within cavity 156 under an elevated temperature and pressure. Alternatively, upper mold support 172 includes inlets 176 and cavity 178. Lower mold support 174 has spring-loaded lifter pins 180. The reconstituted semiconductor wafer 146 is disposed over spring-loaded lifter pins 180. Chase mold 170 is closed so that lower mold support 174 and upper mold support 172 contact carrier 140 with semiconductor die 124 disposed within cavity 178 of the upper mold support and compress spring-loaded lifter pins 180. Encapsulant 186 is injected into cavity 180 through inlets 176. Encapsulant 186 is dispersed under an elevated temperature and pressure around semiconductor die 124. The reconstituted semiconductor wafer 146 is removed from the chase mold. Encapsulant 162 is planarized to expose a back surface 128 of semiconductor die 124. An interconnect structure 208 is formed over reconstituted semiconductor wafer 146. The interconnect structure 208 includes an insulating layer 200 formed over a surface of reconstituted semiconductor wafer 146. Conductive layer 202 is formed over insulating layer 200. The insulating layer 204 is formed over insulating layer 200 and conductive layer 202.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
    providing a semiconductor wafer including a plurality of semiconductor die formed within a surface area of the semiconductor wafer;
    testing each semiconductor die to confirm as a known good semiconductor die;
    singulating the semiconductor die from the semiconductor wafer;
    providing a carrier including a surface area larger than the surface area of the semiconductor wafer;
    disposing the known good semiconductor die over the carrier to form a reconstituted wafer, wherein a number of the known good semiconductor die disposed side-by-side and non-overlapping over the carrier is greater than the total number of the known good semiconductor die singulated from the semiconductor wafer;
    providing a chase mold;
    disposing the reconstituted wafer within the chase mold;
    closing the chase mold with the known good semiconductor die disposed within a cavity of the chase mold;
    dispersing an encapsulant around the known good semiconductor die within the cavity under temperature and pressure;
    removing the reconstituted wafer from the chase mold; and
    forming an interconnect structure over the reconstituted wafer.

2. The method of claim 1, further including planarizing the encapsulant to expose a surface of the known good semiconductor die.

3. The method of claim 1, wherein the surface area of the carrier is 10-50% greater than the surface area of the semiconductor wafer.

4. The method of claim 1, wherein providing the chase mold includes:
    providing an upper mold support including the cavity;
    providing a lower mold support with spring-loaded lifter pins;
    disposing the reconstituted wafer over the spring-loaded lifter pins;
    depositing the encapsulant over the reconstituted wafer;
    closing the chase mold to compress the spring-loaded lifter pins which apply pressure to hold the upper mold support and lower mold support against opposing surfaces of the reconstituted wafer with the known good semiconductor die disposed within the cavity; and
    dispersing the encapsulant under an elevated temperature around the known good semiconductor die.

5. The method of claim 1, further including:
    providing an upper mold support including an inlet and the cavity;
    providing a lower mold support with spring-loaded lifter pins;
    disposing the reconstituted wafer over the spring-loaded lifter pins;
    closing the chase mold to compress the spring-loaded lifter pins which apply pressure to hold the upper mold support and lower mold support against opposing surfaces of the reconstituted wafer with the known good semiconductor die disposed within the cavity; and
    injecting the encapsulant under an elevated temperature through the inlet into the cavity around the known good semiconductor die.

6. A method of making a semiconductor device, comprising:
    providing a semiconductor wafer including a plurality of known good semiconductor die formed within a surface area of the semiconductor wafer;
    singulating the known good semiconductor die from the semiconductor wafer;
    providing a carrier including a surface area larger than the surface area of the semiconductor wafer;
    disposing the known good semiconductor die over a surface of the carrier to form a reconstituted wafer, wherein a number of the known good semiconductor die disposed side-by-side and non-overlapping over the carrier is greater than the total number of the known good semiconductor die singulated from the semiconductor wafer;
    providing a chase mold including an upper mold support and lower mold support with spring-loaded lifter pins;
    disposing the reconstituted wafer within the chase mold over the lower mold support and spring-loaded lifter pins;
    closing the chase mold to compress the spring-loaded lifter pins which apply pressure to hold the upper mold support and lower mold support against opposing surfaces of the reconstituted wafer with the known good semiconductor die disposed within a cavity of the chase mold;

providing an encapsulant around known good the semiconductor die within the cavity under temperature and pressure;

removing the reconstituted wafer from the chase mold; and forming an interconnect structure over the reconstituted wafer.

7. The method of claim 6, wherein the surface area of the carrier is 10-50% greater than the surface area of the semiconductor wafer.

8. The method of claim 6, further including planarizing the encapsulant to expose a surface of the known good semiconductor die.

9. A method of making a semiconductor device, comprising:

providing a semiconductor wafer including a plurality of semiconductor die formed within a surface area of the semiconductor wafer;

testing the semiconductor die to confirm as known good semiconductor die;

singulating the semiconductor die from the semiconductor wafer;

providing a carrier including a surface area larger than the surface area of the semiconductor wafer; and disposing the known good semiconductor die over the carrier to form a reconstituted wafer, wherein a number of the known good semiconductor die disposed side-by-side and non-overlapping over the carrier is greater than the total number of the known good semiconductor die singulated from the semiconductor wafer.

10. The method of claim 9, wherein the surface area of the carrier is 10-50% greater than the surface area of the semiconductor wafer.

11. The method of claim 9, further including:

providing a chase mold;

disposing the reconstituted wafer within the chase mold;

closing the chase mold with the known good semiconductor die disposed within a cavity of the chase mold;

dispersing an encapsulant around the known good semiconductor die within the cavity under temperature and pressure;

removing the reconstituted wafer from the chase mold; and forming an interconnect structure over the reconstituted wafer.

12. The method of claim 11, wherein providing the chase mold includes:

providing an upper mold support including the cavity;

providing a lower mold support with spring-loaded lifter pins;

disposing the reconstituted wafer over the spring-loaded lifter pins;

depositing the encapsulant over the reconstituted wafer;

closing the chase mold to compress the spring-loaded lifter pins which apply pressure to hold the upper mold support and lower mold support against opposing surfaces of the reconstituted wafer with the known good semiconductor die disposed within the cavity; and dispersing the encapsulant under an elevated temperature around the known good semiconductor die.

13. The method of claim 10, further including:

providing an upper mold support including an inlet and the cavity;

providing a lower mold support with spring-loaded lifter pins;

disposing the reconstituted wafer over the spring-loaded lifter pins;

closing the chase mold to compress the spring-loaded lifter pins which apply pressure to hold the upper mold support and lower mold support against opposing surfaces of the reconstituted wafer with the known good semiconductor die disposed within the cavity; and injecting the encapsulant under an elevated temperature through the inlet into the cavity around the known good semiconductor die.

14. The method of claim 10, wherein forming the interconnect structure includes:

forming a first insulating layer over a surface of the reconstituted wafer;

forming a conductive layer over the first insulating layer; and forming a second insulating layer over the first insulating layer and conductive layer.

15. A method of making a semiconductor device, comprising:

providing a semiconductor wafer including a plurality of semiconductor die formed within a surface area of the semiconductor wafer;

testing the semiconductor die to confirm as known good semiconductor die;

singulating the semiconductor die from the semiconductor wafer;

providing a first carrier;

providing a second carrier including a surface area less than a surface area of the first carrier; and disposing the known good semiconductor die over the first carrier using a set of manufacturing tools to form a reconstituted wafer, wherein a number of the known good semiconductor die disposed side-by-side and non-overlapping over the first carrier is greater than the total number of the known good semiconductor die singulated from the semiconductor wafer.

16. The method of claim 15, wherein the surface area of the first carrier is 10-50% greater than the surface area of the second carrier.

17. The method of claim 15, further including:

providing a chase mold;

disposing the reconstituted wafer within the chase mold;

closing the chase mold with the known good semiconductor die disposed within a cavity of the chase mold;

dispersing an encapsulant around the known good semiconductor die within the cavity under temperature and pressure;

removing the reconstituted wafer from the chase mold; and forming an interconnect structure over the reconstituted wafer.

18. A method of making a semiconductor device, comprising:

providing a semiconductor wafer including a plurality of semiconductor die;

testing the semiconductor die to confirm as known good semiconductor die;

singulating the semiconductor die from the semiconductor wafer;

providing a carrier; and disposing the known good semiconductor die over a surface of the carrier to form a reconstituted wafer, wherein a number of the known good semiconductor die disposed side-by-side and non-overlapping over the carrier is greater than the total number of the semiconductor die singulated from the semiconductor wafer.

19. The method of claim 18, wherein a surface area of the carrier is 10-50% greater than a surface area of the semiconductor wafer.

20. The method of claim 18, further including planarizing the encapsulant to expose a surface of the known good semiconductor die.

21. The method of claim 18, further including forming an interconnect structure over the reconstituted wafer.

22. The method of claim 21, wherein forming the interconnect structure includes:
- forming a first insulating layer over a surface of the reconstituted wafer;
- forming a conductive layer over the first insulating layer; and
- forming a second insulating layer over the first insulating layer and conductive layer. pg,43

* * * * *

UNITED STATES PATENT AND TRADEMARK OFFICE
CERTIFICATE OF CORRECTION

PATENT NO. : 8,524,577 B2
APPLICATION NO. : 13/366008
DATED : September 3, 2013
INVENTOR(S) : Yoke Hor Phua and Yung Kuan Hsiao Page 1 of 1

It is certified that error appears in the above-identified patent and that said Letters Patent is hereby corrected as shown below:

In the Claims:

Column 14, Claim 6, Line 48, delete the word "lamer" and replace with the word -- larger --.

Signed and Sealed this
Eighth Day of October, 2013

Teresa Stanek Rea
*Deputy Director of the United States Patent and Trademark Office*